(12) United States Patent
Shih et al.

(10) Patent No.: US 6,740,569 B2
(45) Date of Patent: May 25, 2004

(54) METHOD OF FABRICATING POLYSILICON FILM BY EXCIMER LASER ANNEALING PROCESS

(75) Inventors: Chu-Jung Shih, Taipei (TW); I-Min Lu, Taipei (TW)

(73) Assignee: Toppoly Optoelectronics Corp., Miao-Li Hsien (TW)

( * ) Notice: Subject to any disclaimer, the term of this patent is extended or adjusted under 35 U.S.C. 154(b) by 0 days.

(21) Appl. No.: 10/248,361

(22) Filed: Jan. 14, 2003

(65) Prior Publication Data
US 2004/0018649 A1 Jan. 29, 2004

(30) Foreign Application Priority Data
Jul. 25, 2002 (TW) ........................ 91116644 A

(51) Int. Cl.$^7$ ........................ H01L 21/00; H01L 21/301; H01L 21/20; H01L 21/302
(52) U.S. Cl. ........................ 438/488; 438/149; 438/150; 438/164; 438/166; 438/460; 438/462; 438/482; 438/487; 438/690; 438/713; 438/978
(58) Field of Search ................ 438/149, 150, 438/164, 166, 460, 462, 482, 487, 488, 690, 713, 978

(56) References Cited

U.S. PATENT DOCUMENTS 5,907,770 A * 5/1999 Yamazaki et al. .......... 438/149
6,187,088 B1 * 2/2001 Okumura ..................... 117/8

* cited by examiner

Primary Examiner—John F. Niebling
Assistant Examiner—Stanetta Isaac
(74) Attorney, Agent, or Firm—Winston Hsu

(57) ABSTRACT

A method of fabricating a polysilicon film by an excimer laser annealing process is introduced. First, an amorphous silicon film is deposited on a substrate composed of glass. The amorphous silicon film includes a first region, which is located in the center, with a first thickness, and a second region, which is located in the periphery, with a slant sidewall. The thickness of the amorphous silicon film is measured so as to obtain the profile of the sidewall in the second region. According to the profile of the sidewall, a pre-cursor region is determined for performing an excimer laser annealing process wherein a second thickness in the boundary of the pre-curser regionis smaller than the first thickness so as to increase area of produced polysilicon film.

10 Claims, 4 Drawing Sheets

METHOD OF FABRICATING POLYSILICON FILM BY EXCIMER LASER ANNEALING PROCESS

BACKGROUND OF INVENTION

1. Field of the Invention

The present invention relates to a method of fabricating a polysilicon film, and more particularly, to a method of fabricating a polysilicon film by an excimer laser annealing process.

2. Description of the Prior Art

The progress of science and technology has led to small, effective, and portable intelligent information products becoming a part of our lives. Display devices play an important role because all intelligent information products, such as mobile phones, personal digital assistants (PDAs), or notebooks, need display devices to be a communication interface. However, the fully developed amorphous silicon thin film transistor liquid crystal display (a-Si TFT LCD) devices, which are restricted in their carrier transfer rate, have difficulty in meeting the requirements of being thin, being power saving, and having high resolution. Therefore, the a-Si TFT LCD devices are replaced by low temperature polysilicon (LTPS) thin film transistor liquid crystal display (TFT LCD) devices.

In the liquid crystal display devices, since a normal glass substrate can only work at a temperature below 600° C., fabricating a polysilicon film directly under a high temperature will make the glass substrate twisted. Thus, in a conventional method for fabricating a polysilicon thin film transistor, an expensive quartz substrate is needed and only a small size liquid crystal display panel can be made. Recently, a method of forming a low temperature polysilicon film by crystallizing an amorphous silicon film is gradually developed. Among the methods of forming polysilicon film, the excimer laser annealing process is the major focus.

In the excimer laser annealing process, the amorphous silicon film is melted and then crystallized by absorbing the energy irradiated from the excimer laser beams. Since the rapid absorption due to the short pulse laser only affects the surface of the polysilicon film, the glass substrate can remain in a low temperature. Normally, the excimer laser comprises a XeCl laser, ArF laser, KrF laser and XeF laser, and the excimer layers of different molecules form different wavelengths. The output energy is adjusted according to the thickness of the amorphous silicon film. For example, the output energy of the excimer laser is about 200 to 400 mJ/cm² for an amorphous silicon film of 500 angstroms.

Please refer to FIG. 1 of a schematic diagram of fabricating a polysilicon film by an excimer laser annealing process. As shown in FIG. 1, an amorphous silicon film 12, which is about 500 angstroms in thickness, is formed on a glass substrate 10. The amorphous layer 12 can be formed in different ways, such as a low pressure chemical vapor deposition (LPCVD), plasma enhanced chemical vapor deposition (PECVD), or sputtering process.

Next, the glass substrate 10 is put into a closed chamber for performing the excimer laser annealing process. The chamber has a transparent window. The excimer laser passes through the transparent window and irradiates the amorphous silicon film 12 positioned on the glass substrate 10. According to a predetermined process boundary, the excimer laser scans the area inside the process boundary step by step. The amorphous silicon film 12 inside the process boundary is heated rapidly and forms a fully melted region and a partial melted region. According to the thermal gradient made by these two regions, a crystalloid is formed laterally toward the fully melted region by using some resident solids in the interface of these two regions as nucleuses. Therefore, a polysilicon film is formed. After that, some LCD panel fabricating processes can be followed in advance by using the polysilicon film as a source or drain to form a driving circuit in a LCD device.

However, when the amorphous silicon film 12 is formed, the deposition in each region is not uniform. Please refer to FIG. 2 of a schematic diagram of a local region near an edge of the glass substrate 10 shown in FIG. 1. As shown in FIG. 2, the amorphous silicon film 12 comprises a first region 14 and a second region 16. The amorphous silicon film 12 in the first region 14, which is closer to the center, remains a predetermined thickness, such as 500 angstroms, with a tolerance about 5% to 10%. According to the fabricating process, the amorphous silicon film 12 in the second region 16, which is closer to the edge, has a tilt sidewall in which the thickness decreases from the center to the edge.

When a process boundary of the excimer laser process is set, it is important that the amorphous silicon film 12 inside the process boundary must have enough thickness. If the amorphous silicon film 12 is not thick enough, an ablation problem is made during the excimer laser annealing process. The ablated amorphous silicon film is attached to working machines, such as the windows for laser irradiation, in a way similar to a plating method. It leads to pollute the whole working machines, and affects the following processes seriously.

In the conventional excimer laser annealing process, the processing area does not comprise the whole amorphous silicon film 12 so as avoid the pollution caused by ablation. As shown in FIG. 3, the process boundary 18 is moved from the edge of the amorphous silicon film 12 toward the center of the amorphous silicon film for a safety interval L1, typically 3–5 cm, to solve the ablation problem. However, the setting of the process boundary 18 and the quantity of the safety interval L1 is determined according to operators" own experience. As a result, it leads to some problems. For example, when the safety interval L1 shrinks for increasing the display panel size, the working machines are polluted very often. However, when the safety interval L1 increases, the display panel size is thereby affected.

SUMMARY OF INVENTION

It is therefore a primary objective of the claimed invention to provide a method of setting the process boundary for fabricating a polysilicon film by using an excimer laser annealing process so as to solve the aforementioned problem.

In a preferred embodiment, the claimed invention provides a method of fabricating a polysilicon film by an excimer laser annealing process. First, an amorphous silicon film is deposited on a substrate composed of glass. The amorphous silicon film comprises a first region, which is located in the center, with a first thickness and a second region, which is located in the periphery, with a slant sidewall. The thickness of the amorphous silicon film is measured so as to obtain the profile of the sidewall in the second region. According to the thickness profile of the sidewall, a pre-curser region is determined for performing an excimer laser annealing process wherein a second thickness in the boundary of the pre-curser regionis smaller than the first thickness but greater than a critical thickness of the excimer laser annealing process so as to increase area of produced polysilicon film and avoid the ablation problem. It is an advantage of the claimed invention that the method defines the process boundary according to the profile of the sidewall of the amorphous silicon film so as to avoid the ablation problem and increase area of produced polysilicon film efficiently.

These and other objectives of the claimed invention will no doubt become obvious to those of ordinary skill in the art after reading the following detailed description of the preferred embodiment which is illustrated in the various figures and drawings.

DETAILED DESCRIPTION

Figure 1:
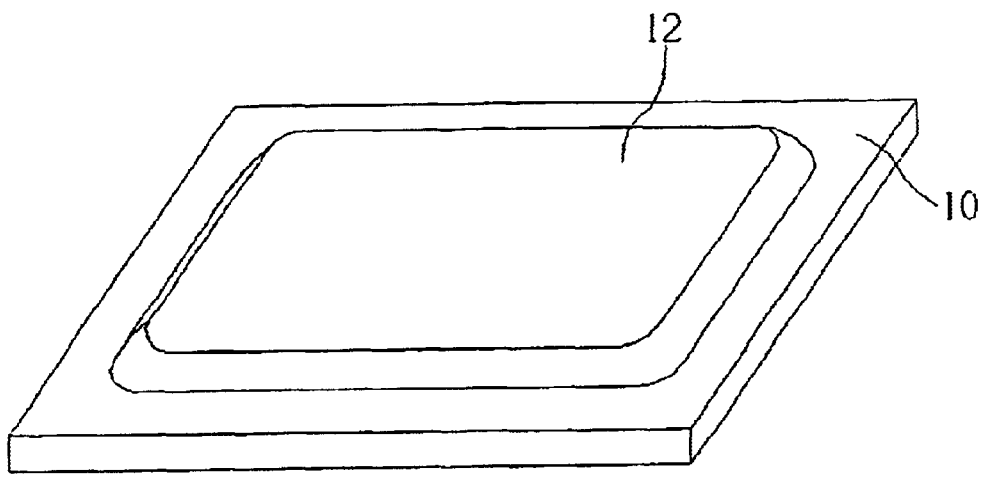
FIG. 1 is a schematic diagram of fabricating a polysilicon film by an excimer laser annealing process according to prior art.
Figure 2:
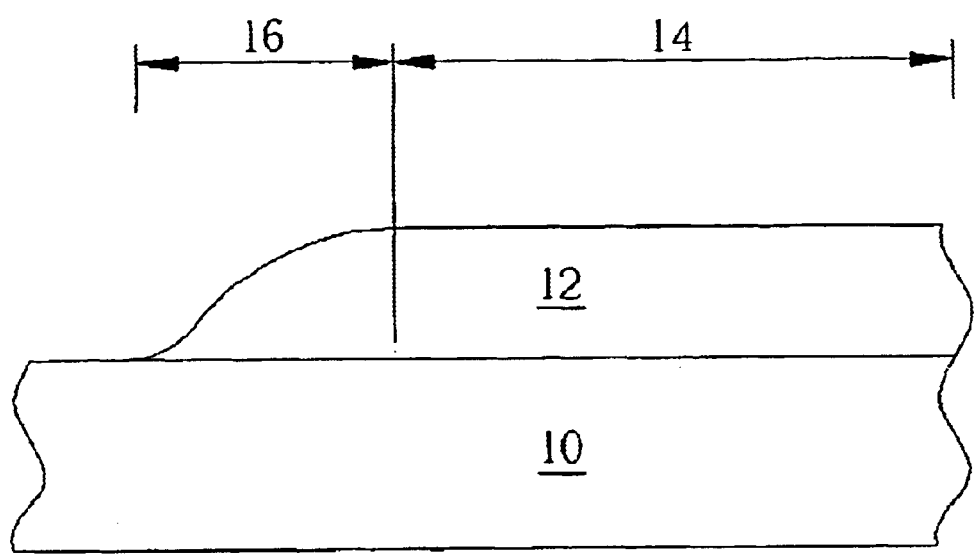
FIG. 2 is a cross-sectional diagram of the amorphous silicon film shown in FIG. 1.
Figure 3:
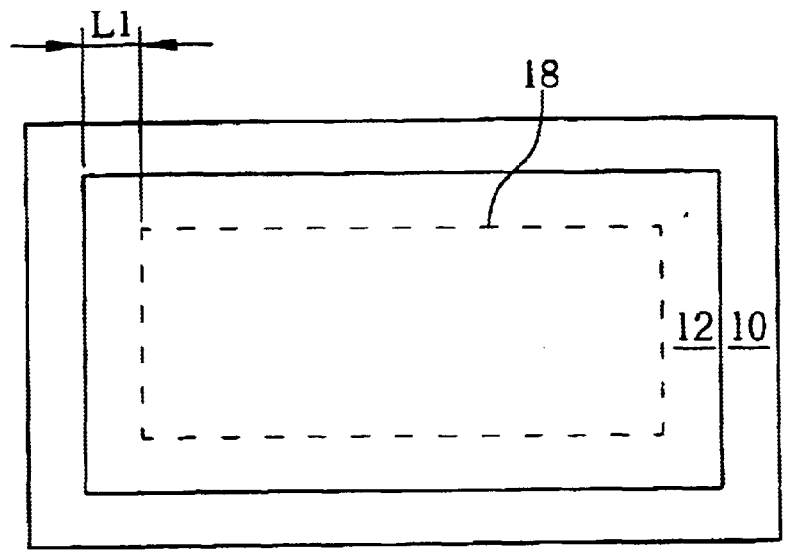
FIG. 3 is a schematic diagram of setting a process boundary according to the prior art.
Figure 4:
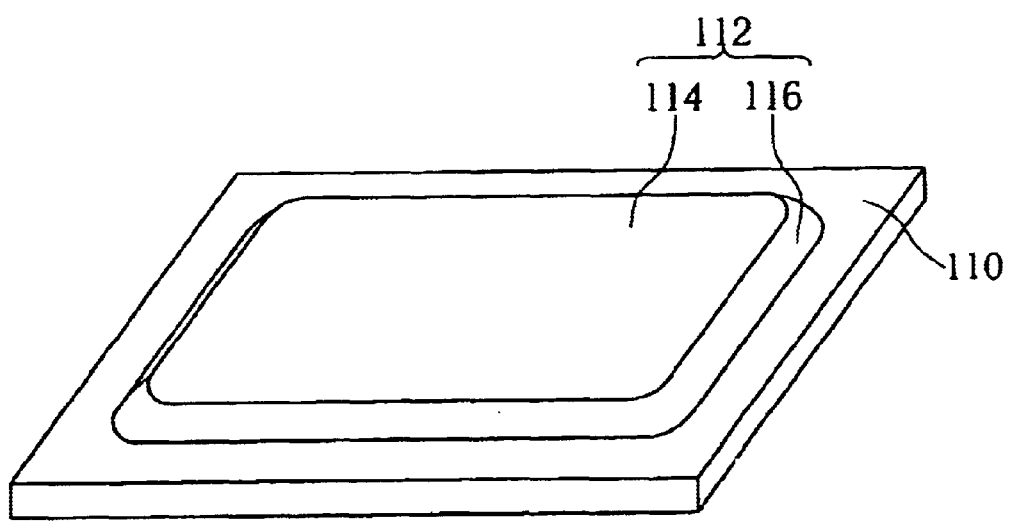
FIG. 4 and FIG. 5 are schematic diagrams of fabricating a polysilicon film by an excimer laser annealing process according to the present invention.

Please refer to FIG. 4 of a schematic diagram of fabricating a polysilicon film by an excimer laser annealing process according to the present invention. As shown in FIG. 4, an amorphous silicon film 12 is formed on a glass substrate 110. The amorphous silicon film 112 can be formed by performing an LPCVD process, a PECVD process, or a sputtering process. In the preferred embodiment of the present invention, the produced amorphous silicon film 112 is 750 mm in length, 620 mm in width, and 500 angstroms in thickness.

The amorphous silicon film 112 comprises a first region 114 and a second region 116. The first region 114 is located in the center and the second region 116 is located in the periphery and surrounded to the first region 114. In the first region 114, the thickness of the amorphous silicon film 112 is kept at a predetermined standard thickness, such as 300 to 800 angstroms. In the preferred embodiment of the present invention, the standard thickness is 500 angstroms, which is the same as mentioned above, with a tolerance less than 5–10%. In the second region 116, a tilt sidewall structure is formed due to the deposition process and the thickness is gradually decreasing from the center to the edge of the amorphous silicon film 112.

Figure 5:
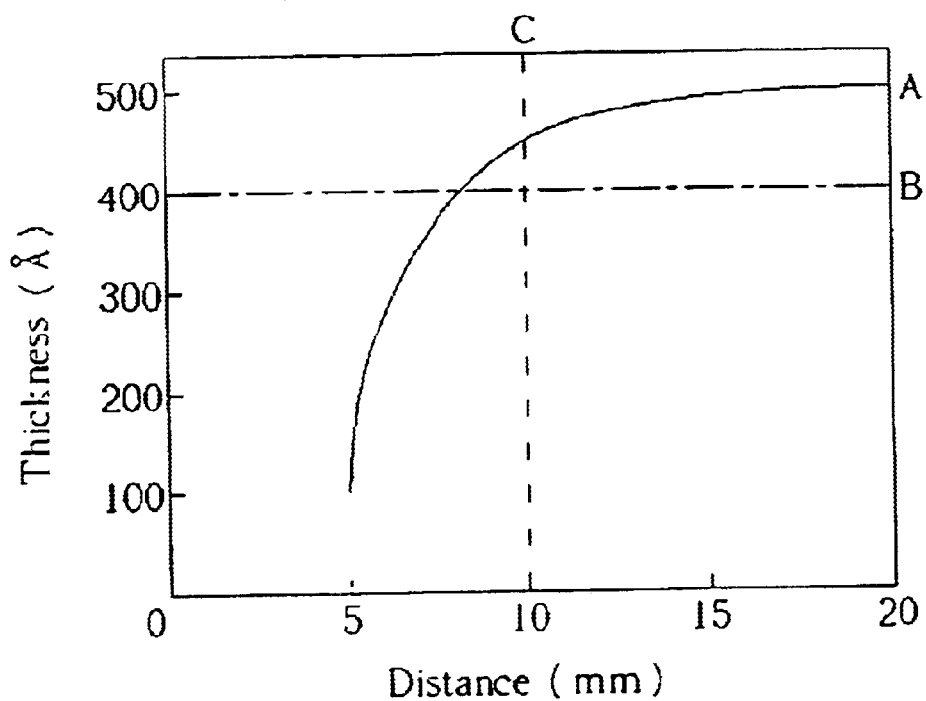

Next, the thickness of the amorphous silicon film 112 is measured to obtain a thickness profile of the amorphous silicon film 112, especially a part thereof near the edge. Please refer to FIG. 5 of a schematic diagram of the thickness profile of the amorphous silicon film 112. The X axis of FIG. 5 is a distance from an edge of the substrate 110 and the Y axis of FIG. 5 is the thickness. Curve A means the thickness profile of the amorphous silicon film 112 near the edge. Line B shows a critical thickness of ablation which can be obtained from experiment data. In addition, the thickness profile and the critical thickness should be constant if the fabricating process is stable. Therefore, only one test sample is required for performing the thickness measurement and the critical thickness experiment instead of the whole batch.

As shown in FIG. 5, it is obvious that a process boundary of a maximum processing area without ablation is located on the cross point of curve A and line B means. If the process boundary is moved forward to the edge of the glass substrate 110 in advance, the ablation can not be avoided and the working machines are polluted easily. As a result, for reducing the possibility of pollution, the process boundary is normally set in the right side of the cross point of curve A and line B in practice, such as the dotted line C in FIG. 5 which is located on the tilt sidewall of the amorphous silicon film 112. For example, if the dotted line C is used as the process boundary, the thickness of the amorphous silicon film 112 of the dotted line C is about 450 angstroms, which is about 90% of that in the first region 114. In contrast with the prior art, the process boundary in each side of the present invention is moved forward to the edge of the substrate 110 for an interval about 5–20 mm and the processing area is thus increased by about 5–10%.

After that, an excimer laser annealing process can be performed according to the processing area enclosed by the predetermined process boundary for melting the amorphous film 112 and crystallizing the melted amorphous film 112 to a polysilicon film. The theory or method of the excimer laser annealing process is similar to that of the prior art mentioned above, and is not repeated again. After forming the polysilicon film, the polysilicon film can be used as a drain or a source of a low temperature polysilicon thin film transistor so as to form driving circuits of the LCD panel in the following fabricating process.

In the method of the present invention, the thickness of the amorphous silicon film is measured to obtain the thickness profile of the amorphous silicon film in the edge nearby. Then, some experiments are done to obtain the critical thickness of the amorphous silicon film in the excimer laser annealing process. After that, the process boundary of the excimer laser annealing process can be determined according to aforementioned data. As a result, the present invention not only prevents the working machines from being polluted but also increases the area of the produced polysilicon film efficiently and improves the throughput in advance.

In contrast with the prior art method of determining the process boundary according to personal experience, the present invention can determine the process boundary properly to improve the process stability and increase the throughput at the same time. In other words, the pollution caused by the excimer laser annealing process can be avoided. Furthermore, the maximum processing area can be obtained and the formed amorphous film can be utilized efficiently so as to improve the economic benefits.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of fabricating a polysilicon film by an excimer laser annealing (ELA) process, the method comprising the following steps:

providing a substrate;

forming an amorphous silicon film on the substrate;

measuring the thickness of the amorphous silicon film to obtain a thickness profile of the amorphous silicon film and define the amorphous silicon film as a first region located in a center and a second region located in a periphery, the amorphous silicon film in the first region having a first thickness and the amorphous silicon film in the second region having a tilt sidewall;

determining a position of a process boundary of the excimer laser annealing process according to the thickness profile of the tilt sidewall, the amorphous silicon film in the process boundary having a second thickness smaller than the first thickness; and performing the excimer laser annealing process to crystallize the amorphous silicon film inside the process boundary into a polysilicon film.

2. The method of the claim 1 wherein the thickness of the amorphous silicon film in the process boundary is larger than a critical thickness to prevent the amorphous silicon film from ablating and polluting during the excimer laser annealing process.

3. The method of the claim 1 wherein the second thickness is about 90% of the first thickness.

4. The method of the claim 1 wherein the substrate is a glass substrate.

5. The method of the claim 1 wherein the process boundary is located on the tilt sidewall.

6. The method of the claim 1 wherein the first thickness is about 300 to 800 angstroms.

7. The method of the claim 1 wherein the excimer laser annealing process is performed by using molecules of XeCl, ArF, KrF, or XeF.

8. The method of the claim 1 wherein the polysilicon film is used as a drain or source of a liquid crystal display.

9. The method of the claim 1 wherein the excimer laser annealing process is performed in a reaction chamber.

10. The method of the claim 9 wherein the reaction chamber comprises a transparent window and the excimer laser outputs to the amorphous silicon film in the reaction chamber through the transparent window.

* * * * *